United States Patent
Liao

(10) Patent No.: US 9,559,696 B2
(45) Date of Patent: Jan. 31, 2017

(54) GATE DRIVER AND RELATED CIRCUIT BUFFER

(71) Applicant: Sitronix Technology Corp., Hsinchu County (TW)

(72) Inventor: Min-Nan Liao, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 15/183,776

(22) Filed: Jun. 15, 2016

(65) Prior Publication Data

US 2016/0294390 A1    Oct. 6, 2016

Related U.S. Application Data

(62) Division of application No. 14/460,346, filed on Aug. 14, 2014, now Pat. No. 9,438,235.

(Continued)

(30) Foreign Application Priority Data

May 23, 2014  (TW) .............................. 103118172 A

(51) Int. Cl.
*H03K 3/00*          (2006.01)
*H03K 19/003*        (2006.01)
(Continued)

(52) U.S. Cl.
CPC ...... *H03K 19/00315* (2013.01); *G09G 3/3677* (2013.01); *H03K 17/687* (2013.01);
(Continued)

(58) Field of Classification Search
CPC ................. H03K 19/00315; H03K 19/018507; H03K 17/687; G09G 2310/0289; G09G 2310/0291
(Continued)

(56) References Cited

U.S. PATENT DOCUMENTS 6,781,870 B1 * 8/2004 Kushida ................ G11C 11/417
                                                365/154
7,817,460 B2 * 10/2010 Yamagami ............... G11C 5/14
                                                365/154
(Continued)

FOREIGN PATENT DOCUMENTS

CN          1617034 A      5/2005
CN        101868919 A     10/2010
(Continued)

*Primary Examiner* — Ryan Jager
(74) *Attorney, Agent, or Firm* — Winston Hsu; Scott Margo

(57) ABSTRACT

A circuit buffer for outputting a voltage signal having a magnitude greater than a withstand voltage of any circuit element in the circuit buffer includes a first transistor and a second transistor. The first transistor includes a first terminal and a second terminal electrically connected to an input terminal and an output terminal of the circuit buffer respectively, a third terminal electrically connected to a first power supply terminal, and a fourth terminal electrically connected to the third terminal of the first transistor. The second transistor includes a first terminal and a second terminal electrically connected to the input terminal and the output terminal of the circuit buffer respectively, a third terminal electrically connected to a second power supply terminal, and a fourth terminal electrically connected to the third terminal of the second transistor. Voltages of the first and second power supply terminal are switched between two different levels, respectively.

7 Claims, 10 Drawing Sheets

Related U.S. Application Data

(60) Provisional application No. 61/928,403, filed on Jan. 16, 2014.

(51) Int. Cl.
  *H03K 19/0185* (2006.01)
  *H03K 17/687* (2006.01)
  *G09G 3/36* (2006.01)

(52) U.S. Cl.
  CPC .............. *H03K 19/018507* (2013.01); *G09G 2310/0289* (2013.01); *G09G 2310/0291* (2013.01)

(58) Field of Classification Search
  USPC ........................................................ 327/109
  See application file for complete search history.

(56) References Cited

U.S. PATENT DOCUMENTS

| | | | |
|---|---|---|---|
| 8,742,829 B2 | 6/2014 | Mottola | |
| 2004/0080340 A1* | 4/2004 | Hidaka | G11C 5/147 326/83 |
| 2007/0285142 A1* | 12/2007 | Shin | H03K 17/145 327/208 |
| 2007/0285152 A1* | 12/2007 | Fujita | G05F 1/56 327/541 |
| 2008/0055200 A1* | 3/2008 | Lee | G09G 3/296 345/60 |
| 2008/0284774 A1* | 11/2008 | Yamashita | G09G 3/3233 345/212 |
| 2009/0283663 A1* | 11/2009 | Ryuzaki | H04N 5/3597 250/208.1 |
| 2011/0148840 A1* | 6/2011 | Tsai | G09G 3/3241 345/211 |
| 2012/0030494 A1* | 2/2012 | Yu | H03K 17/693 713/340 |
| 2014/0112081 A1* | 4/2014 | Grover | G11C 11/417 365/189.011 |
| 2015/0295562 A1 | 10/2015 | Agarwal | |

FOREIGN PATENT DOCUMENTS

| | | |
|---|---|---|
| CN | 102543010 A | 7/2012 |
| JP | H06152383 A | 5/1994 |
| JP | H0774616 A | 3/1995 |
| JP | 2006323040 A | 11/2006 |
| JP | 201160876 A | 3/2011 |
| JP | 2014171109 A | 9/2014 |
| TW | 201227703 | 7/2012 |
| TW | 201340065 | 10/2013 |

\* cited by examiner

| Vin | VDD | VSS | Vout |
|-----|-----|-----|------|
| V3  | V1  | V3  | V1   |
| V2  | V2  | V4  | V4   |

GATE DRIVER AND RELATED CIRCUIT BUFFER

CROSS REFERENCE TO RELATED APPLICATIONS

This application is a divisional application of application Ser. No. 14/460,346, filed on Aug. 14, 2014 and entitled "GATE DRIVER AND RELATED CIRCUIT BUFFER", which claims the benefit of U.S. Provisional Application No. 61/928,403, filed on Jan. 16, 2014 and titled "Gate Driver use Medium Voltage Devices", the contents of which are incorporated herein by reference.

BACKGROUND OF THE INVENTION

1. Field of the Invention

The present invention relates to a gate driver and a circuit buffer, and more particularly, to a gate driver capable of realizing a high output voltage and a circuit buffer for constructing the gate driver.

2. Description of the Prior Art

With the popularity of liquid crystal displays (LCD), LCD driver integrated circuits (IC) are becoming increasingly important in the market. A general LCD applies a dual scanning method, which requires a gate driver and a source driver. The source driver outputs voltages to the LCD panel according to pixel data in order to switch liquid crystal molecules for determining gray scales of pixels. The gate driver may turn the liquid crystal display unit on or off via a high voltage.

A driver IC of an LCD uses low voltage circuit elements (having a withstand voltage in the range of 1.5-1.8 V), medium voltage circuit elements (having a withstand voltage in the range of 5-6 V) and high voltage circuit elements (having a withstand voltage in the range of 25-30 V) for its process, which is a mixed-mode process having three types of circuit elements with different withstand voltages. The low voltage circuit elements are usually used in digital logic circuits. The medium voltage circuit elements are usually used for driving the image data (i.e. the source driver). The high voltage circuit elements are usually used in the gate driver. Since a wide variety of circuit elements are required, higher numbers of masks and layers may be needed for the LCD driver IC process, which results in a higher cost.

Thus, there is a need to provide a novel structure of an LCD driver IC that uses fewer numbers of masks and layers for the process.

SUMMARY OF THE INVENTION

It is an objective of the present invention to provide a gate driver using medium voltage circuit elements to realize a high voltage output, and omit the usage of high voltage circuit elements in a gate driver process. By reducing the numbers of masks and layers for the process, the cost can be reduced, the process time will be shortened, and the process speed is increased.

The present invention discloses a circuit buffer for outputting a voltage signal. The circuit buffer comprises a first transistor and a second transistor. The first transistor comprises a first terminal electrically connected to an input terminal of the circuit buffer; a second terminal electrically connected to an output terminal of the circuit buffer, wherein the output terminal is utilized for outputting the voltage signal; a third terminal electrically connected to a first power supply terminal; and a fourth terminal electrically connected to the third terminal of the first transistor. The second transistor comprises a first terminal electrically connected to the input terminal of the circuit buffer and the first terminal of the first transistor; a second terminal electrically connected to the output terminal of the circuit buffer and the second terminal of the first transistor; a third terminal electrically connected to a second power supply terminal; and a fourth terminal electrically connected to the third terminal of the second transistor. A voltage of the first power supply terminal is switched between a first voltage level and a second voltage level, a voltage of the second power supply terminal is switched between a third voltage level and a fourth voltage level, the first voltage level is greater than the second voltage level, the third voltage level is greater than the fourth voltage level, and an amplitude of the voltage signal is greater than a withstand voltage of any circuit element in the circuit buffer.

The present invention further discloses a gate driver for outputting a voltage signal. The gate driver comprises a plurality of circuit buffers, which comprise a first circuit buffer, a second circuit buffer and a third circuit buffer. The first circuit buffer comprises a first power supply terminal for receiving a first voltage; a second power supply terminal for receiving a second voltage; an input terminal for receiving a first input signal; and an output terminal for outputting the voltage signal according to the first voltage, the second voltage and the first input signal. The second circuit buffer comprises a third power supply terminal for receiving a third voltage; a fourth power supply terminal electrically connected to the input terminal of the first circuit buffer, for receiving the first input signal; an input terminal for receiving a second input signal; and an output terminal electrically connected to the first power supply terminal, for outputting the first voltage to the first circuit buffer according to the third voltage, the first input signal and the second input signal. The third circuit buffer comprises a fifth power supply terminal electrically connected to the input terminal of the first circuit buffer, for receiving the first input signal; a sixth power supply terminal for receiving a fourth voltage; an input terminal for receiving a third input signal; and an output terminal electrically connected to the second power supply terminal, for outputting the second voltage to the first circuit buffer according to the first input signal, the fourth voltage and the third input signal. The first voltage, the second voltage, the third voltage and the fourth voltage are switched between two different voltage levels, and an amplitude of the voltage signal is greater than a withstand voltage of any circuit element in the gate driver.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
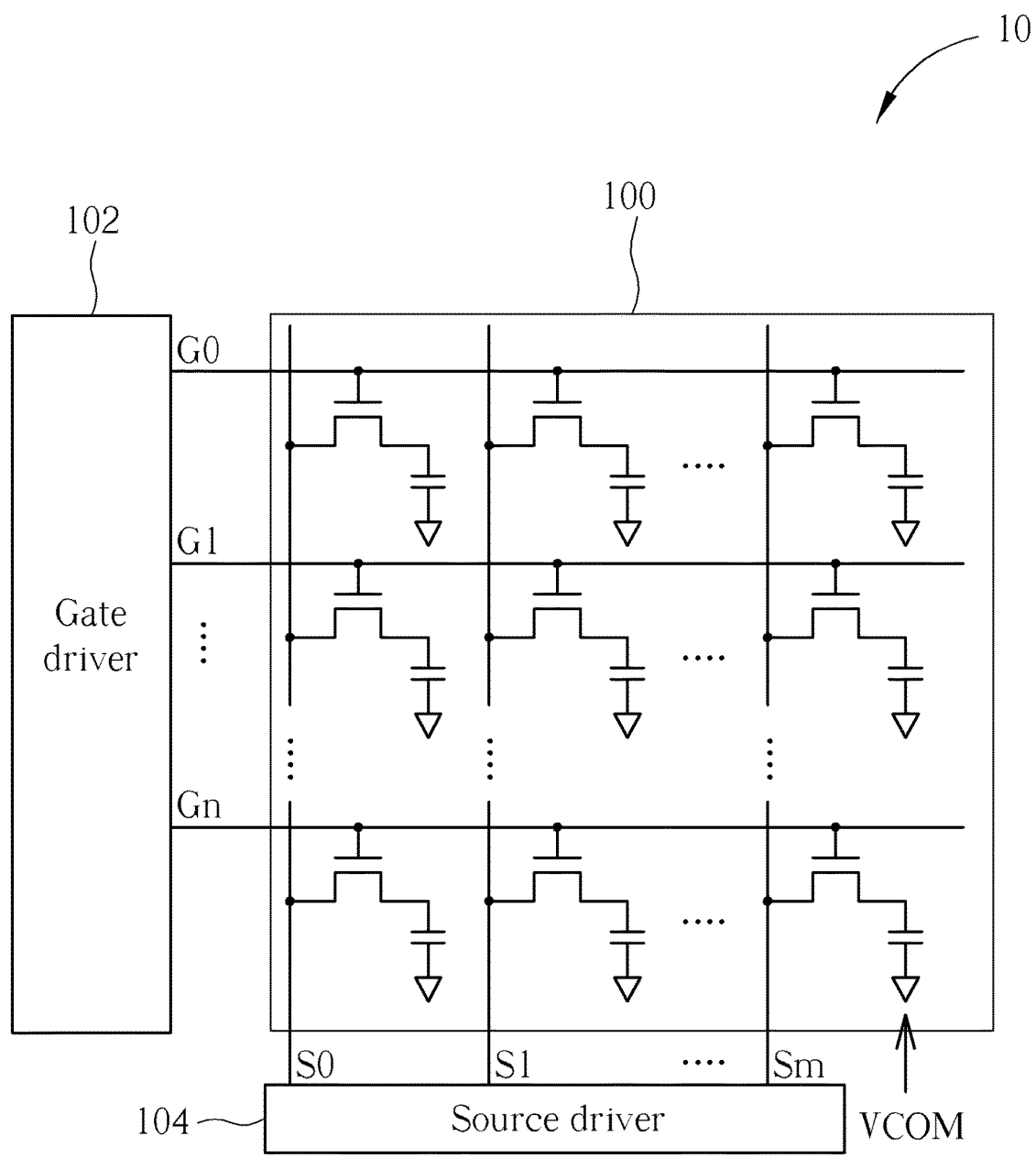
FIG. 1 is a schematic diagram of a circuit system for a liquid crystal display (LCD).

FIG. 1 is a schematic diagram of a circuit system 10 for a liquid crystal display (LCD). The circuit system 10 includes a display panel 100, a gate driver 102 and a source driver 104. The display panel 100 includes a plurality of transistors, each corresponding to a pixel. The gate and source of each transistor are driven by the gate driver 102 and the source driver 104, respectively, in order to display images. The drain of each transistor is electrically connected to a liquid crystal capacitor and a reference voltage VCOM. The gate driver 102 may in turn output gate driving signals G0-Gn to turn on the display units, which allows the source driver 104 to output source driving signals S0-Sm to the liquid crystal capacitors. Each pixel unit on the display panel 100 may display a relative gray scale, accordingly, to thereby display an entire image.

Figure 2:
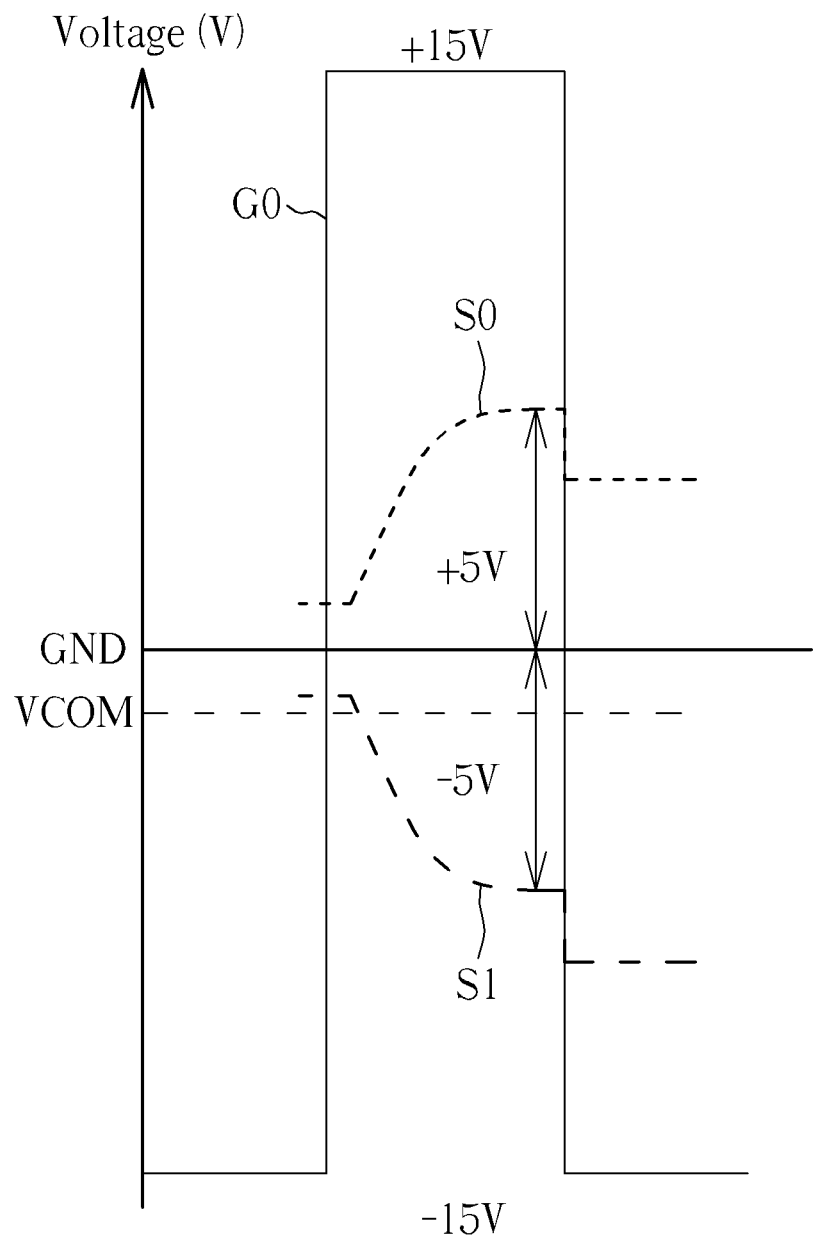
FIG. 2 is a waveform diagram of signals in the circuit system.

FIG. 2 is a waveform diagram of signals in the circuit system 10. In comparison with the source driving signals S0-Sm which have voltages within the positive range 5-6 V and the negative range 5-6 V, the gate driving signals G0-Gn may have voltages reaching to positive 15 V and negative 15 V. The conventional gate driver outputs the gate driving signals G0-Gn via high voltage circuit elements having a withstand voltage reaching to 30 V.

Figure 3:
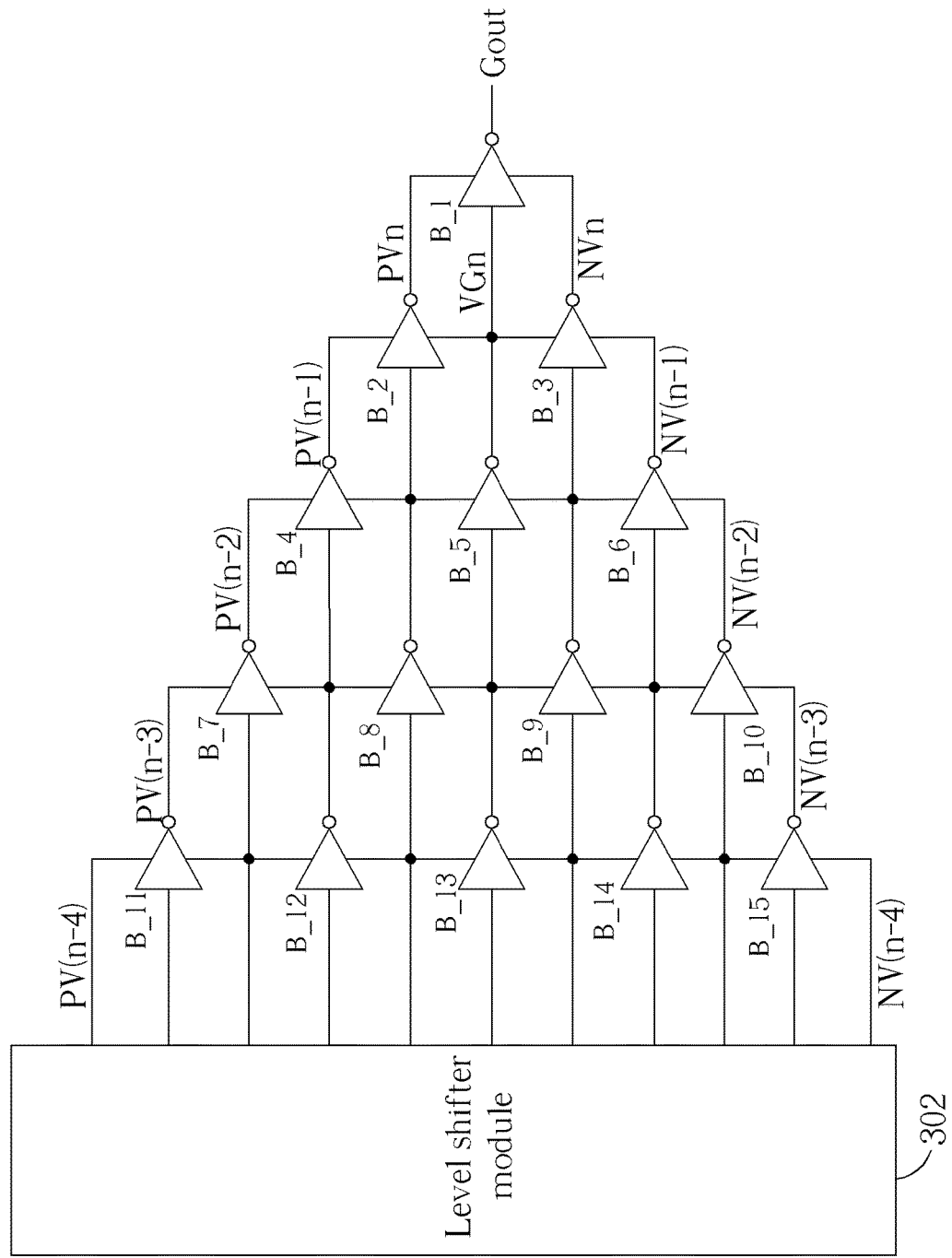
FIG. 3 is a schematic diagram of a gate driver according to an embodiment of the present invention.

In order to omit the usage of high voltage circuit elements in the process, the present invention applies multiple stacked circuit buffers to realize a high voltage output by using medium voltage circuit elements having a withstand voltage near 5 V in the circuit buffers. FIG. 3 is a schematic diagram of a gate driver 30 according to an embodiment of the present invention. The gate driver 30 includes circuit buffers B_1-B_15 and a level shifter module 302. Each of the circuit buffers B_1-B_15 includes a first power supply terminal, a second power supply terminal, an input terminal and an output terminal. The first power supply terminal and the second power supply terminal may receive a first voltage and a second voltage, respectively, for the operations of each of the circuit buffers B_1-B_15. The input terminal may receive an input signal. The output terminal may generate an output signal according to the first voltage, the second voltage and the input signal and then output the output signal.

In detail, the circuit buffers B_1-B_15 in the gate driver 30 may be divided into five stages according to its arrangement, wherein the circuit buffers B_11-B_15 are located in the first stage, the circuit buffers B_7-B_10 are located in the second stage, the circuit buffers B_4-B_6 are located in the third stage, the circuit buffers B_2-B_3 are located in the fourth stage, and the circuit buffer B_1 is located in the fifth stage. The number of circuit buffers in each stage is the number of circuit buffers in the previous stage minus one, and the number of circuit buffer in the last stage (i.e. the fifth stage) is one. The output signals of the circuit buffers B_2-B_15 located from the first stage to the fourth stage may be outputted to the power supply terminals of a circuit buffer in the next stage, and the output signals of several circuit buffers (e.g. B_5, B_8, B_9 and B_12-B_14) may be outputted to the input terminal of a circuit buffer in the stage next to the next stage. In addition, the output signal of the circuit buffer B_1 located in the fifth stage (i.e. the last stage) may be regarded as a voltage signal Gout of the gate driver 30 (i.e. the gate driving signals G0-Gn shown in FIG. 2).

The two power supply terminals of each circuit buffer B_1-B_10 located from the second stage to the fifth stage are electrically connected to the output terminals of two circuit buffers in the previous stage, respectively; hence, the voltage of these two power supply terminals may be provided from the output signals of the two circuit buffers in the previous stage, respectively. The input terminal of each circuit buffer B_1-B_6 located from the third stage to the fifth stage is electrically connected to the output terminal of a circuit buffer in the stage previous to the previous stage; hence, the input signal of this input terminal may be provided from the output signal of the circuit buffer in the stage previous to the previous stage. The voltages and the input signals of the circuit buffers B_11-B_15 located in the first stage and the input signals of the circuit buffers B_7-B_10 located in the second stage may be provided by the level shifter module 302. The level shifter module 302, which includes one or more level shifters composed of medium voltage circuit elements having a withstand voltage near 5 V, may output fixed voltages and output signals with an amplitude equal to 5 V. In the gate driver 30, the fixed voltages provided by the level shifter module 302 include voltage levels −10 V, −5 V, 0 V, +5 V and +10 V. The output signals provided by the level shifter module 302 includes a signal switched between voltage levels −10 V and −5 V, a signal switched between voltage levels −5 V and 0 V, a signal switched between voltage levels 0 V and +5 V, a signal switched between voltage levels +5 V and +10 V, and a signal switched between voltage levels +10 V and +15 V. Note that the above fixed voltages and output signals having amplitudes equal to 5 V may also be realized by other methods or other circuit structures, such as a charge pump or voltage converter; this should not be limited to the level shifter module 302 of the gate driver 30.

Figures 4, 5:
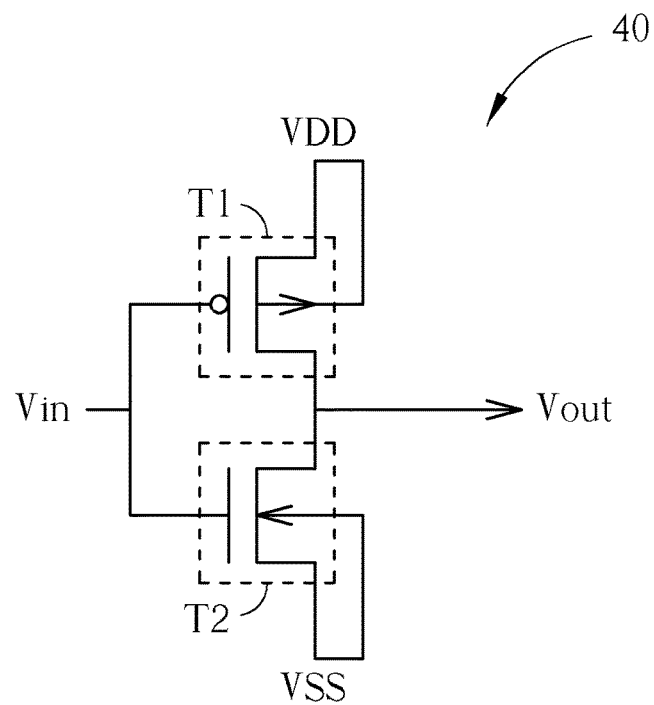
FIG. 4 is a schematic diagram of the structure of a circuit buffer according to an embodiment of the present invention.
FIG. 5 is a schematic diagram of voltage switching in the circuit buffer.

FIG. 4 is a schematic diagram of the structure of a circuit buffer 40 according to an embodiment of the present invention. The circuit buffer 40 may be utilized for realizing any of the circuit buffers B_1-B_15 in the gate driver 30. The circuit buffer 40 includes transistors T1 and T2. The transistor T1 may include four terminals, wherein the first terminal is electrically connected to an input terminal of the circuit buffer 40, the second terminal is electrically connected to an output terminal the circuit buffer 40, the third terminal is electrically connected to a first power supply terminal, and the fourth terminal is electrically connected to the third terminal of the transistor T1. Similarly, the transistor T2 may also include four terminals, wherein the first terminal is electrically connected to the input terminal of the circuit buffer 40 and the first terminal of the transistor T1, the second terminal is electrically connected to the output terminal of the circuit buffer 40 and the second terminal of the transistor T1, the third terminal is electrically connected to a second power supply terminal, and the fourth terminal is electrically connected to the third terminal of the transistor T2. Preferably, the transistor T1 may be a P-type metal oxide semiconductor field effect transistor (PMOSFET), and the transistor T2 may be an N-type metal oxide semiconductor field effect transistor (NMOSFET). In such a condition, the first terminal, the second terminal, the third terminal and the fourth terminal of the transistor T1 are the gate, drain, source and base of the PMOSFET, respectively; the first terminal, the second terminal, the third terminal and the fourth terminal of the transistor T2 are the gate, drain, source and base of the NMOSFET, respectively.

In the circuit buffer 40, a voltage VDD of the first power supply terminal may be switched between a voltage level V1 and a voltage level V2, and a voltage VSS of the second power supply terminal may be switched between a voltage level V3 and a voltage level V4, wherein the voltage level V1 is greater than the voltage level V2 and the voltage level V3 is greater than the voltage level V4. According to the structure of the circuit buffer 40, a voltage VIN of the input terminal may be switched between the voltage level V3 and the voltage level V2; hence, a voltage VOUT of the output terminal may be switched between the voltage level V1 and the voltage level V4. FIG. 5 is a schematic diagram of voltage switching in the circuit buffer 40. When the input voltage VIN of the circuit buffer 40 is equal to V3, the voltage of the first power supply terminal VDD is equal to V1 and the voltage of the second power supply terminal VSS is equal to V3, the circuit buffer 40 may generate the output voltage VOUT equal to V1. When the input voltage VIN of the circuit buffer 40 is equal to V2, the voltage of the first power supply terminal VDD is equal to V2 and the voltage of the second power supply terminal VSS is equal to V4, the circuit buffer 40 may generate the output voltage VOUT equal to V4. As long as the voltage difference between the voltage levels V1 and V3 and the voltage difference between the voltage levels V2 and V4 are not greater than the withstand voltage between any two terminals of the transistor T1 or T2 (e.g. 5 V), both the transistors T1 and T2 may not be damaged. Although the voltage difference between the voltage levels V1 and V2 (i.e. the amplitude of the voltage VDD) and the voltage difference between the voltage levels V3 and V4 (i.e. the amplitude of the voltage VSS) may be greater than the withstand voltage of the transistors T1 and T2, every two terminals of the transistors T1 and T2 may still be within the range of the withstand voltage, which may not cause any damage in this circuit structure while outputting high voltage signals greater than the withstand voltage of the transistors T1 and T2, e.g. the gate driving signals G0-Gn shown in FIG. 2 having an amplitude equal to 30 V.

As mentioned above, the circuit buffer 40 may be realized in any of the circuit buffers B_1-B_15 in the gate driver 30. Taking the circuit buffer B_1 as an example, the gate driver 30 needs to output the voltage signal Gout switched between voltage levels −15 V and +15 V; the voltage levels V1 and V4 of the output signal of the circuit buffer B_1 are +15 V and −15 V, respectively. In order to let the voltage difference between the voltage levels V1 and V3 fall within the withstand voltage of the transistors T1 and T2, the voltage level V3 may be equal to +10 V. In order to let the voltage difference between the voltage levels V2 and V4 fall within the withstand voltage of the transistors T1 and T2, the voltage level V2 may be equal to −10 V.

Figure 6:
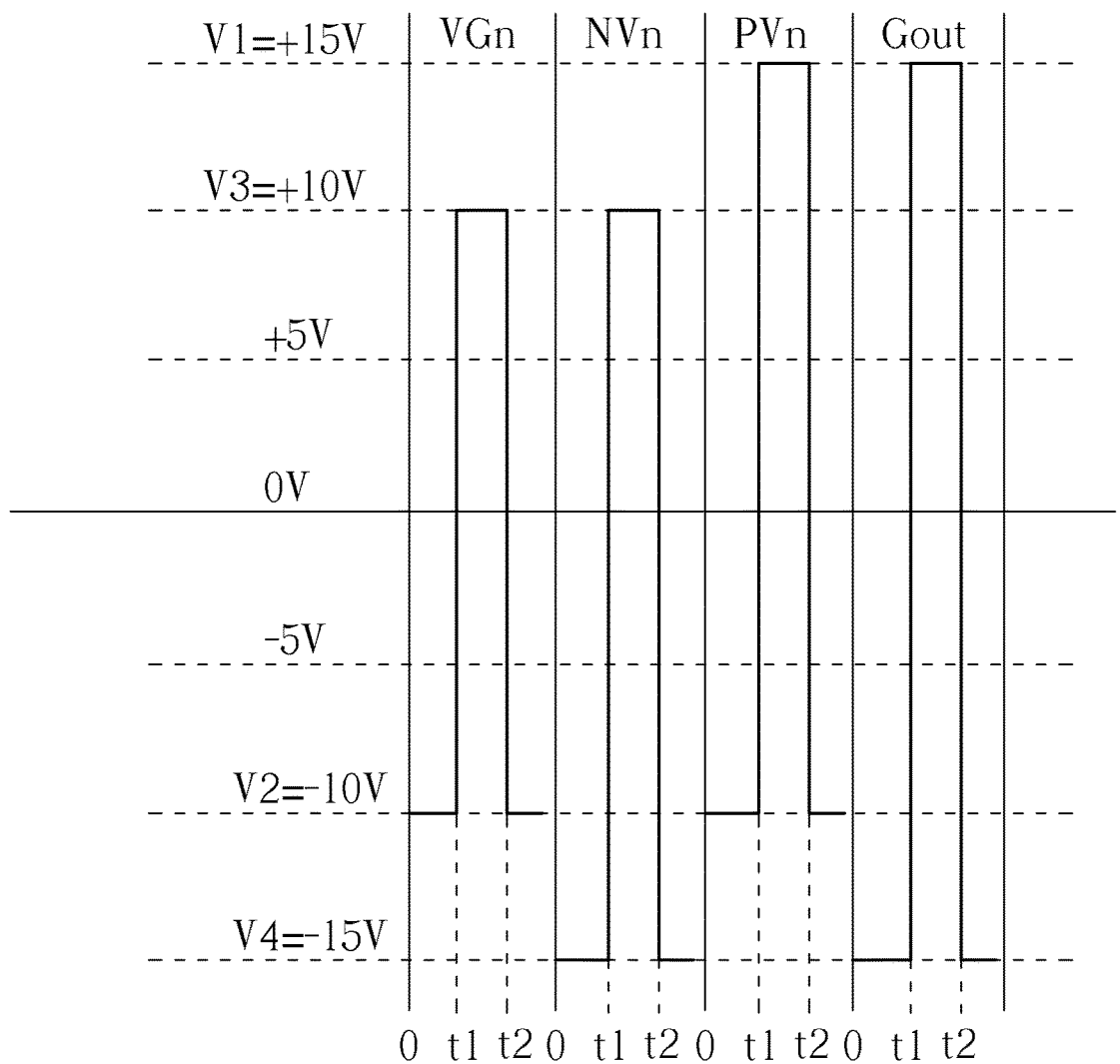
FIG. 6 is a waveform diagram of the two power supply terminals, the input terminal and the output terminal of the circuit buffer.

FIG. 6 is a waveform diagram of the two power supply terminals, the input terminal and the output terminal of the circuit buffer B_1. The voltages PVn and NVn, the input signal VGn and the voltage signal Gout corresponding to the two power supply terminals, the input terminal and the output terminal, respectively, have a pulse signal between times t1 and t2. In the pulse signal, the voltage PVn and the voltage signal Gout are equal to +15 V, and the voltage NVn and the input signal VGn are equal to +10 V. In such a situation, the voltage difference between any two terminals of the transistors in the circuit buffer B_1 may not be greater than 5 V. Beyond the pulse signal (e.g. the time before t1 or the time after t2), the voltage PVn and the input signal VGn are equal to −10 V, and the voltage NVn and the voltage signal Gout are equal to −15 V. In such a situation, the voltage difference between any two terminals of the transistors in the circuit buffer B_1 may not be greater than 5 V. As a result, all of the transistors in the circuit buffer B_1 may be realized by using medium voltage circuit elements with a withstand voltage in the range 5-6 V, while the circuit buffer B_1 is able to output high voltage signals with an amplitude reaching to 30 V.

Note that, considering the transistors in the circuit buffer B_1, the voltage difference between any two terminals may not be greater than the withstand voltage (i.e. 5 V) in a steady state. When the status of the transistors is switching (e.g. from a lower voltage −15 V or −10 V to a higher voltage +15 V or +10 V), all of the voltages PVn and NVn, the input signal VGn and the voltage signal Gout may rise or fall simultaneously; the voltage difference between any two terminals may not exceed the withstand voltage in this case.

Figure 7:
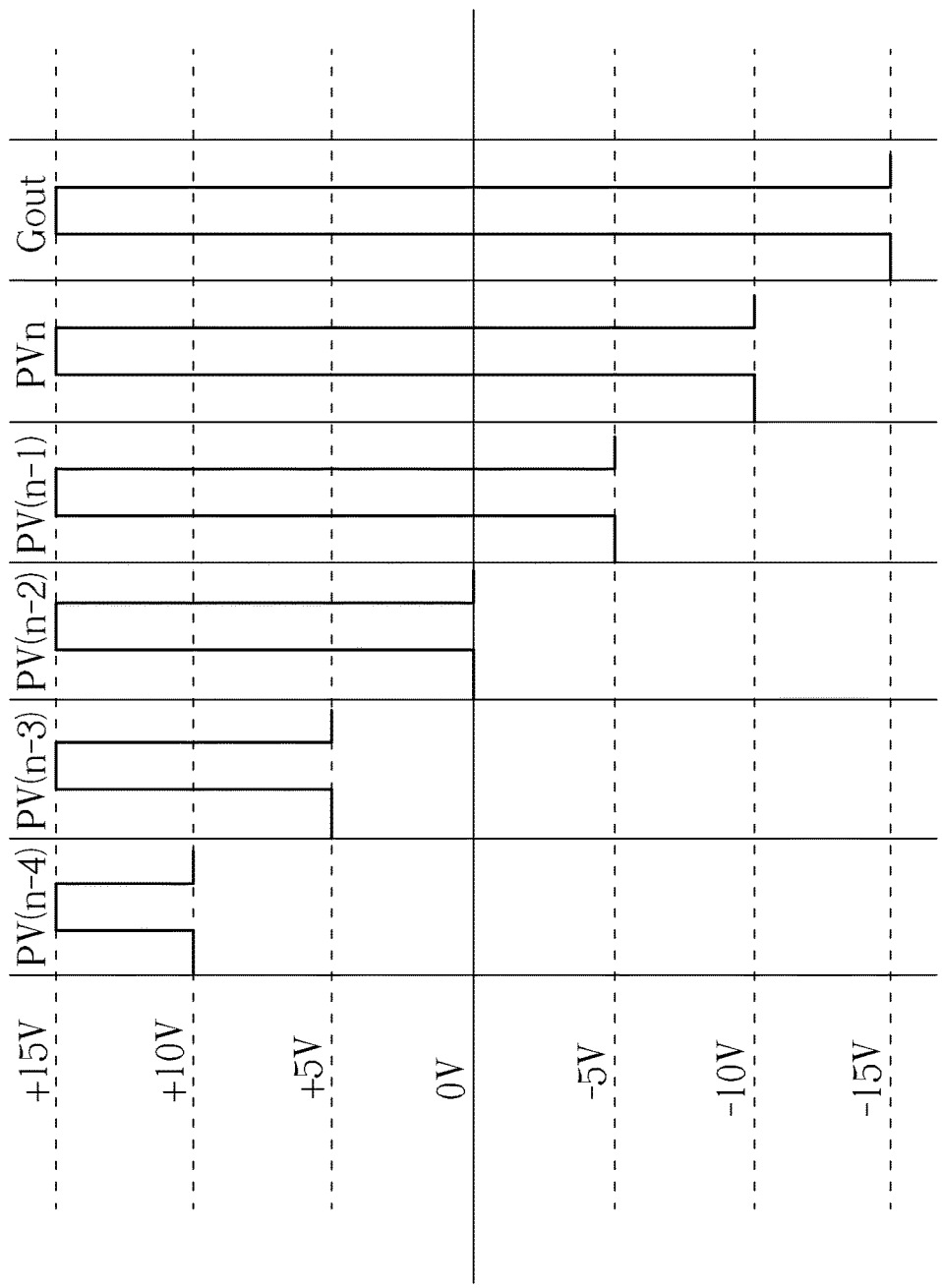
FIG. 7 is a schematic diagram of an output signal stack in positive terminals of the gate driver.

When the structure of the circuit buffer 40 is realized in all of the circuit buffers B_1-B_15 in the gate driver 30, the high voltage signals with greater amplitude may be stacked up. FIG. 7 is a schematic diagram of an output signal stack in positive terminals of the gate driver 30. The power supply terminal of the circuit buffer B_11 first receives a signal PV(n−4) from the level shifter module 302 as a voltage source, where the amplitude of the signal PV(n−4) is equal to 5 V, and the signal PV(n−4) is switched between voltage levels +15 V and +10 V. The circuit buffer B_11 then generates an output signal PV(n−3) having an amplitude equal to 10 V and switched between voltage levels +15 V and +5 V according to its voltage source PV(n−4), and outputs the output signal PV(n−3) to the circuit buffer B_7 as a voltage source. The circuit buffer B_7 then generates an output signal PV(n−2) having an amplitude equal to 15 V and switched between voltage levels +15 V and 0 V according to its voltage source PV(n−3), and outputs the output signal PV(n−2) to the circuit buffer B_4 as a voltage source. The circuit buffer B_4 then generates an output signal PV(n−1) having an amplitude equal to 20 V and switched between voltage levels +15 V and −5 V according to its voltage source PV(n−2), and outputs the output signal PV(n−1) to the circuit buffer B_2 as a voltage source. The circuit buffer B_2 then generates an output signal PVn having an amplitude equal to 25 V and switched between voltage levels +15 V and −10 V according to its voltage source PV(n−1), and outputs the output signal PVn to the circuit buffer B_1 as a voltage source. The circuit buffer B_1 then generates the voltage signal Gout as the output signal of the gate driver 30, wherein the voltage signal Gout has an amplitude equal to 30 V and is switched between voltage levels +15 V and −15 V.

Figure 8:
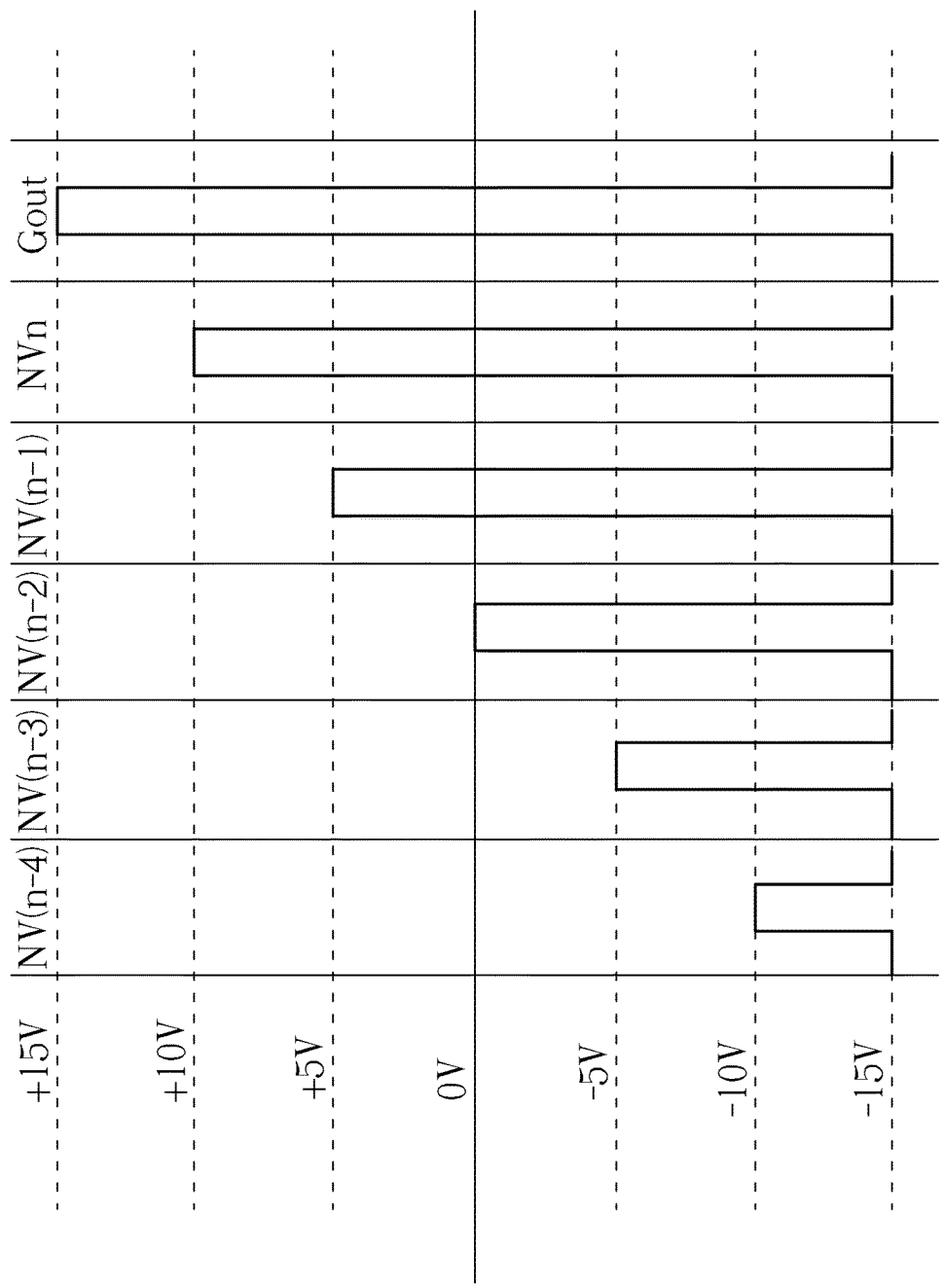
FIG. 8 is a schematic diagram of an output signal stack in negative terminals of the gate driver.

Similarly, a high voltage signal with greater amplitude may also be stacked up in negative terminals of the gate driver 30 by a similar method. FIG. 8 is a schematic diagram of an output signal stack in negative terminals of the gate driver 30. The power supply terminal of the circuit buffer B_15 first receives a signal NV(n−4) from the level shifter module 302 as a voltage source, where the amplitude of the signal NV(n−4) is equal to 5 V, and the signal NV(n−4) is switched between voltage levels −15 V and −10 V. The circuit buffer B_15 then generates an output signal NV(n−3) having an amplitude equal to 10 V and switched between voltage levels −15 V and −5 V according to its voltage source NV(n−4), and outputs the output signal NV(n−3) to the circuit buffer B_10 as a voltage source. The circuit buffer B_10 then generates an output signal NV(n−2) having an amplitude equal to 15 V and switched between voltage levels −15 V and 0 V according to its voltage source NV(n−3), and outputs the output signal NV(n−2) to the circuit buffer B_6 as a voltage source. The circuit buffer B_6 then generates an output signal NV(n−1) having an amplitude equal to 20 V and switched between voltage levels −15 V and +5 V according to its voltage source NV(n−2), and outputs the output signal NV(n−1) to the circuit buffer B_3 as a voltage source. The circuit buffer B_3 then generates an output signal NVn having an amplitude equal to 25 V and switched between voltage levels −15 V and +10 V according to its voltage source NV(n−1), and outputs the output signal NVn to the circuit buffer B_1 as a voltage source. The circuit buffer B_1 then generates the voltage signal Gout as the output signal of the gate driver 30, wherein the voltage signal Gout has an amplitude equal to 30 V and is switched between voltage levels −15 V and +15 V.

Figure 9:
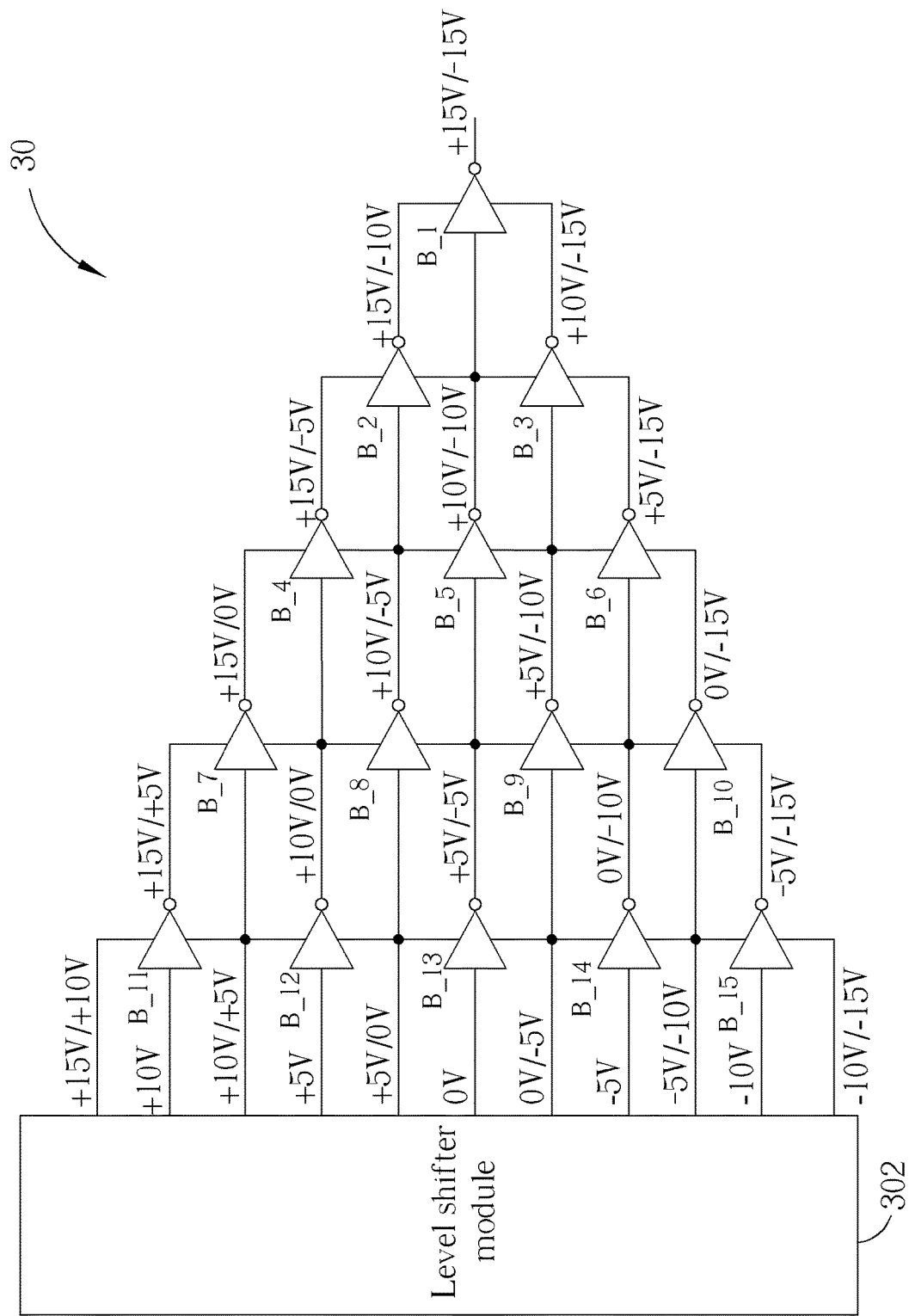
FIG. 9 illustrates the signal levels stacked up by the gate driver.

According to the above method, if the withstand voltage of the transistors in the circuit buffer is 5 V, the present invention can stack up any voltage signals having an amplitude equal to a multiple of 5 V based on the voltage level 5 V while the voltage difference between any two terminals of each transistor does not exceed 5 V. The signal levels stacked up by the gate driver 30 are illustrated in FIG. 9, wherein a signal switched between voltage levels VA and VB is denoted by VA/VB, and a signal having a fixed voltage VA is denoted by VA.

Since the voltage signal Gout with an amplitude 30 V may be realized by circuit elements having a withstand voltage 5 V, the high voltage circuit elements may not be required in the gate driver 30. The numbers of masks and layers required for the high voltage circuit elements in the process can therefore be omitted, which further reduces the cost of an LCD driver integrated circuit (IC). In addition, due to the simplification of masks and layers, the process time of the LCD driver IC may also be reduced, and the production speed may increase accordingly. The present invention can provide different benefits for different types of processes. For example, for a certain process, exclusion of the high voltage circuit elements may decrease the required masks by about 5, and the process time may decrease by 7-9 days.

Note that the present invention may use medium voltage circuit elements to realize the gate driver. The gate driving signals with a higher voltage can be outputted by stacking circuit buffers layer by layer wherein the voltage difference between every two terminals of each circuit element does not exceed its withstand voltage. Those skilled in the art can make modifications and alternations accordingly. For example, in the above embodiments, all of the voltages or signals are equal to 5 V or a multiple of 5 V, but in a practical circuit, errors in the circuit elements or signals may cause slight variations in the voltages, e.g. 4.9 V or 5.1 V. In addition, the stage numbers of the circuit buffers in a gate driver should not be considered as a limitation of the present invention. Those skilled in the art should adjust the stage numbers of the circuit buffers according to system requirements, in order to output signals having different amplitudes. For example, via the circuit elements with a withstand voltage equal to 5 V, a voltage signal with an amplitude 40 V may be realized by stacking more stages of circuit buffers. In another embodiment, circuit elements having a lower withstand voltage (e.g. 3 V) may also be applied to realize a voltage signal with amplitude equal to 30 V by stacking more stages. Circuit elements having a higher withstand voltage (e.g. 10 V) may also be utilized to realize a voltage signal with amplitude equal to 30 V by stacking fewer stages, which is not limited herein. The level shifter module 302 may also include any numbers of level shifters with any structures. The number and voltage levels of the output signals of the level shifter module 302 may be adjusted according to the magnitude of the withstand voltage of the transistors and the voltage levels required for the voltage signals, which is not limited herein.

Figure 10:
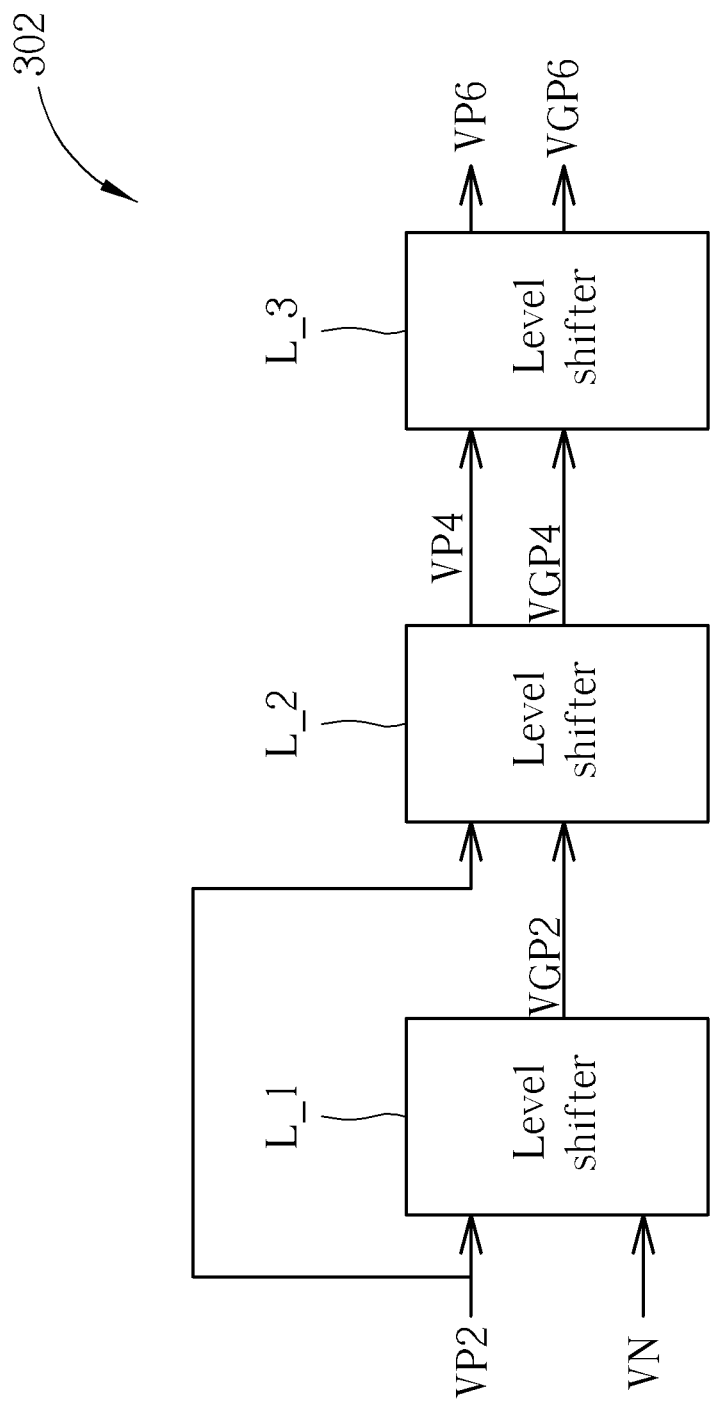
FIG. 10 is a schematic diagram of an exemplary implementation of the level shifter module.

FIG. 10 is a schematic diagram of an exemplary implementation of the level shifter module 302. The level shifter module 302 includes level shifters L_1-L_3. The level shifter L_1 may generate a signal VGP2 switched between voltage levels 0 V and +5 V according to a fixed voltage VN (equal to 0 V) and a fixed voltage VP2 (equal to +5 V) available in the circuit. The level shifter L_2 then generates a fixed voltage VP4 (equal to +10 V) by stacking the signal VGP2 with the fixed voltage VP2, in order to output a signal VGP4 switched between voltage levels +5 V and +10 V. The level shifter L_3 then generates a fixed voltage VP6 (equal to +15 V) by stacking the signal VGP4 with the fixed voltage VP4, in order to output a signal VGP6 switched between voltage levels +10 V and +15 V. The level shifter module 302 may also generate signals with negative voltage levels, but this will not be narrated herein for brevity.

Figure 11:
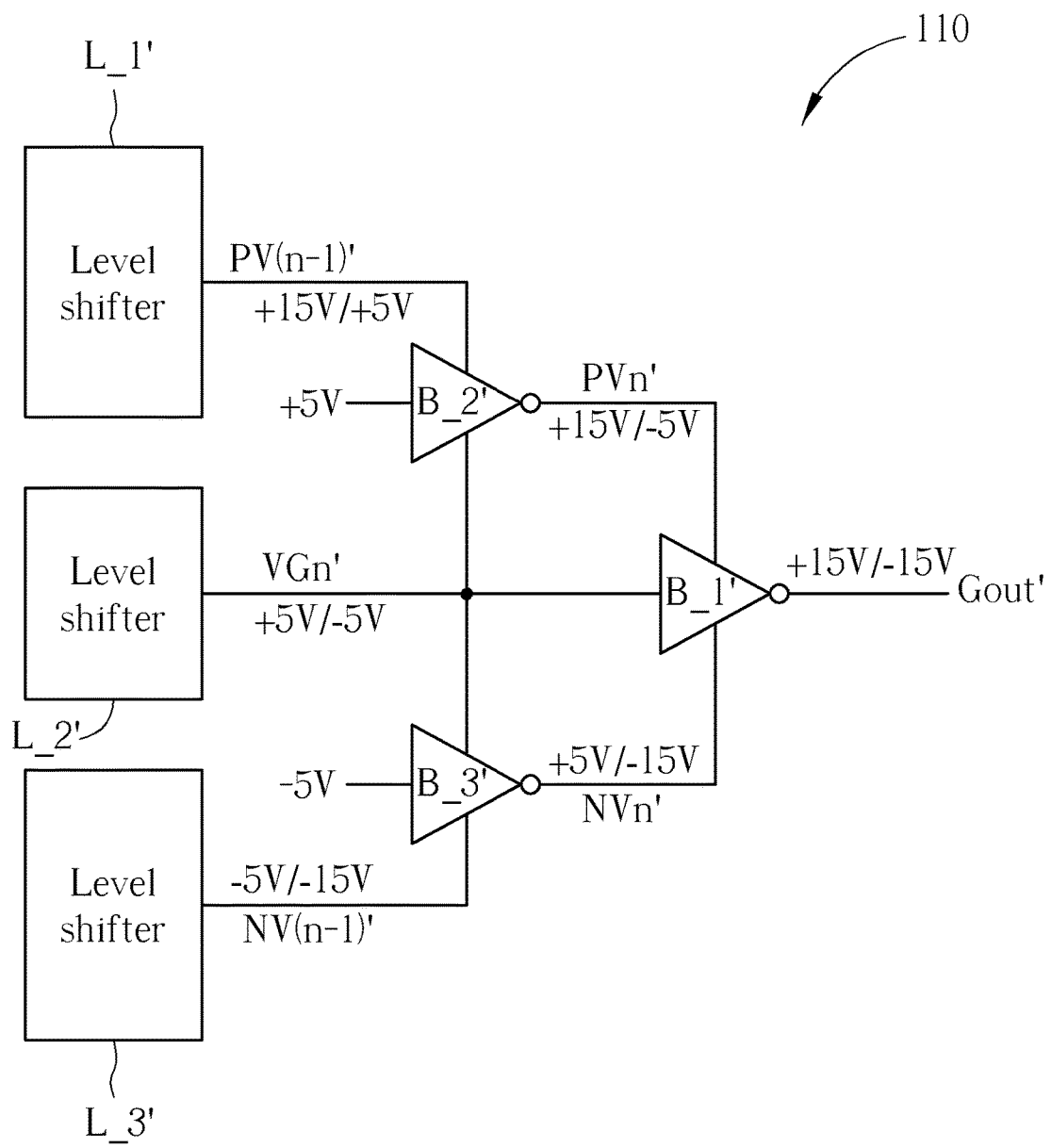
FIG. 11 is a schematic diagram of another gate driver according to an embodiment of the present invention.

FIG. 11 is a schematic diagram of another gate driver 110 according to an embodiment of the present invention. The gate driver 110 includes level shifters L_1'-L_3' and circuit buffers B_1'-B_3'. The main difference between the gate driver 110 and the gate driver 30 is that the withstand voltage of the transistors in the gate driver 110 is 10 V, while the withstand voltage of the transistors in the gate driver 30 is 5 V. Therefore, the gate driver 110 may use circuit buffers with fewer stages to realize a voltage signal switched between voltage levels +15 V and −15 V. In the gate driver 110, the level shifters L_1'-L_3' may generate signals PV(n−1)', VGn' and NV(n−1)', respectively, which all have amplitude 10 V. The signal PV(n−1)' is switched between voltage levels +15 V and +5 V, the signal VGn' is switched between voltage levels +5 V and −5 V, and the signal NV(n−1)' is switched between voltage levels −5 V and −15 V. In the circuit buffer B_2', the two power supply terminals receive signals PV(n−1)' and VGn', respectively, and the input terminal receives a fixed voltage +5 V; the circuit buffer B_2' will thereby generate an output signal PVn'. The signal PVn', which is switched between voltage levels +15 V and −5 V, is outputted to the first power supply terminal of the circuit buffer B_1'. In the circuit buffer B_3', the two power supply terminals receive signals NV(n−1)' and VGn', respectively, and the input terminal receives a fixed voltage −5 V; hence, the circuit buffer B_3' may generate an output signal NVn'. The signal NVn', which is switched between voltage levels +5 V and −15 V, is outputted to the second power supply terminal of the circuit buffer B_1'. The input terminal of the circuit buffer B_1' receives the signal VGn', and then generates the voltage signal Gout' switched between voltage levels +15 V and −15 V according to the signals PVn', NVn' and VGn'. The voltage signal Gout' may be regarded as the output signal of the gate driver 110.

In the prior art, a driver IC of an LCD includes low voltage circuit elements, medium voltage circuit elements and high voltage circuit elements for a mixed-mode process having three types of circuit elements with different withstand voltages. Since a wide variety of circuit elements are required, higher numbers of masks and layers may be needed, which results in a higher cost. In comparison, the present invention can use medium voltage circuit elements to realize the gate driver. The gate driving signals with a high voltage can be outputted by stacking circuit buffers layer by layer wherein the voltage difference between every two terminals of each circuit element does not exceed its withstand voltage, so the high voltage circuit elements are not required. The present invention can therefore omit the numbers of masks and layers required for the high voltage circuit elements in the process, which further reduces the cost of the LCD driver IC. Due to the simplification of masks and layers, the process time of the LCD driver IC may also be reduced, and the production speed may increase accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit buffer, for outputting a voltage signal, the circuit buffer comprising:
    a first transistor, comprising:
        a first terminal, electrically connected to an input terminal of the circuit buffer;
        a second terminal, electrically connected to an output terminal of the circuit buffer, wherein the output terminal is utilized for outputting the voltage signal;
        a third terminal, electrically connected to a first power supply terminal; and
        a fourth terminal, electrically connected to the third terminal of the first transistor; and
    a second transistor, comprising:
        a first terminal, electrically connected to the input terminal of the circuit buffer and the first terminal of the first transistor;
        a second terminal, electrically connected to the output terminal of the circuit buffer and the second terminal of the first transistor;
        a third terminal, electrically connected to a second power supply terminal; and
        a fourth terminal, electrically connected to the third terminal of the second transistor;
    wherein a voltage of the first power supply terminal is switched between a first voltage level and a second voltage level, a voltage of the second power supply terminal is switched between a third voltage level and a fourth voltage level, the first voltage level is greater than the second voltage level, the third voltage level is greater than the fourth voltage level, and an amplitude of the voltage signal is greater than a withstand voltage of any circuit element in the circuit buffer;
    wherein the first power supply terminal is electrically connected to an output terminal of another circuit buffer, and the second power supply terminal is electrically connected to an output terminal of a further circuit buffer.

2. The circuit buffer of claim 1, wherein the input terminal of the circuit buffer is electrically connected to an output terminal of another circuit buffer.

3. The circuit buffer of claim 1, wherein the first power supply terminal and the second power supply terminal are electrically connected to a level shifter module.

4. The circuit buffer of claim 1, wherein the input terminal of the circuit buffer is electrically connected to a level shifter module.

5. The circuit buffer of claim 1, wherein a voltage difference between the first voltage level and the second voltage level is greater than a withstand voltage between any two terminals of the first terminal, the second terminal, the third terminal and the fourth terminal of the first transistor or the second transistor.

6. The circuit buffer of claim 1, wherein a voltage difference between the third voltage level and the fourth voltage level is greater than a withstand voltage between any two terminals of the first terminal, the second terminal, the third terminal and the fourth terminal of the first transistor or the second transistor.

7. The circuit buffer of claim 1, wherein the circuit buffer is utilized for a gate driver.

* * * * *